United States Patent [19]
Imai et al.

[11] Patent Number: 6,069,092
[45] Date of Patent: May 30, 2000

[54] DRY ETCHING METHOD AND SEMICONDUCTOR DEVICE FABRICATION METHOD

[75] Inventors: Shinichi Imai; Nobuhiro Jiwari, both of Osaka, Japan

[73] Assignee: Matsushita Electronics Corporation, Osaka, Japan

[21] Appl. No.: 09/178,431

[22] Filed: Oct. 26, 1998

[30] Foreign Application Priority Data

Oct. 27, 1997 [JP] Japan ................................. 9-293749

[51] Int. Cl.[7] .................................................. H01L 21/00
[52] U.S. Cl. ........................................... 438/723; 438/743
[58] Field of Search .................................. 438/723, 743, 438/714, 715; 216/67, 79

[56] References Cited

U.S. PATENT DOCUMENTS

| | | | |
|---|---|---|---|
| 5,366,590 | 11/1994 | Kadomura | 438/723 |
| 5,595,627 | 1/1997 | Inazawa et al. | 438/723 X |
| 5,770,098 | 6/1998 | Araki et al. | 438/723 X |

FOREIGN PATENT DOCUMENTS

| | | |
|---|---|---|
| 6-244152 | 9/1994 | Japan . |
| 8-092768 | 4/1996 | Japan . |

*Primary Examiner*—William Powell
*Attorney, Agent, or Firm*—McDermott, Will & Emery

[57] ABSTRACT

The present invention discloses a dry etching method using a high density plasma, in which a fluorocarbon gas, whose fluorine to carbon ratio is less than 2:1, is used. Such arrangement provides improved etching selectivity ratios to the resist film. The adding of an inert gas and oxygen to such a fluorocarbon gas provides further improved etching selectivity ratios and improved etching rates.

24 Claims, 8 Drawing Sheets

(C5F8)                      (C5F10)

DRY ETCHING METHOD AND SEMICONDUCTOR DEVICE FABRICATION METHOD

BACKGROUND OF THE INVENTION

The present invention relates to a dry etching method, and it further relates to a method of fabricating a semiconductor device.

In recent years, the scale of semiconductor device integration has been improved dramatically. Lithography technology, which is now playing an important role in improving the scale of semiconductor device integration, requires finer formation of patterns. With a view to meeting such a requirement, a light source with a shorter wavelength has been used. Currently, KrF excimer laser lithography is a dominant technique in the field of lithography technology. In such a photolithography process step, it becomes necessary to achieve reductions in the thickness of photoresist films that are formed on substrates upon which process steps are performed, to achieve higher resolution.

A reactive dry etching technique with a $C_4F_8$ plasma has been employed to form contact holes in silicon dioxide films. One problem of the dry etching method is that the etching selectivity ratio, which means the ratio of the etching rate of the silicon dioxide film (R2) to that of the photoresist film (R1)(i.e., R2/R1), is low. Low etching selectivity ratios cause a photoresist film to become reduced in thickness during an etching process, resulting in partially etching a silicon dioxide film masked with the photoresist film. If such undesired etching occurs, then there occurs a short circuit between interconnect lines therefore causing considerable damage to the fabrication yield and reliability of semiconductor devices.

Bearing in mind the aforesaid problems with the prior art techniques, the present invention was made. Accordingly an object of the present invention is to provide a dry etching method capable of providing improved etching selectivity ratios to the photoresist film and a method of fabricating a semiconductor device employing such a dry etching technology.

SUMMARY OF THE INVENTION

The present invention provides a dry etching method comprising the step of introducing a gas containing at least carbon and fluorine into a reactor with a plasma formed therein, wherein the fluorine and the carbon are contained in the gas at a ratio of less than 2:1.

It is preferred that an inert gas is added to the carbon/fluorine containing gas.

It is preferred that a gas containing an inert gas and oxygen is added to the carbon/fluorine containing gas.

The present invention provides another dry etching method comprising the steps of (a) placing a substrate having thereon a silicon dioxide film in a dry etching apparatus, (b) introducing a gas containing at least carbon and fluorine into the dry etching apparatus, and (c) generating a plasma in the dry etching apparatus, wherein the fluorine and the carbon are contained in the gas at a ratio of less than 2:1, and wherein a radio frequency voltage having a peak-to-peal voltage of 1.5 kV or less is applied to the substrate.

The present invention provides a dry etching method comprising the steps of (a) placing a substrate having thereon a silicon dioxide film into a dry etching apparatus, (b) introducing a gas containing at least carbon and fluorine into the dry etching apparatus, and (c) generating a plasma in the dry etching apparatus, wherein the fluorine and the carbon are contained in the gas at a ratio of less than 2:1, and wherein the oxide silicon film of the substrate is etched in a reactor heated to above 100 degrees centigrade.

It is preferred that the plasma has a plasma density of $10^{11}$ $cm^{-3}$ or more.

It is preferred that the carbon/fluorine containing gas contains molecules selected from a group of $C_5F_8$, $C_4F_6$, $C_3F_4$, $C_2F_2$, and $(CF_3CO)_2$.

It is preferred that the inert gas contains atoms selected from a group of Ar, Xe, and Kr.

It is preferred that the oxygen containing gas contains molecules selected from a group of $O_2$, CO, and $CO_2$.

The present invention provides a method of fabricating a semiconductor device comprising the steps of (a) depositing a silicon dioxide film on a substrate, (b) applying a resist mask on the silicon dioxide film, (c) introducing a gas containing at least carbon and fluorine into a dry etching apparatus, and (d) etching the silicon dioxide film with a plasma of the carbon/fluorine containing gas, wherein the fluorine and the carbon are contained in the gas at a ratio of less than 2:1.

It is preferred that an inert gas is added to the carbon/fluorine containing gas.

It is preferred that a gas containing an inert gas and oxygen is added to the carbon/fluorine containing gas.

It is preferred that in the etching step, a radio frequency voltage having a peak-to-peak voltage of 1.5 kV or less is applied to the substrate.

It is preferred that the etching step is carried out in a reactor of the dry etching apparatus heated to above 100 degrees centigrade.

The present invention provides another method of fabricating a semiconductor device comprising the steps of: depositing a silicon dioxide film on a substrate, applying a resist mask on said silicon dioxide film, introducing a gas containing at least carbon and fluorine into a dry etching apparatus, and etching said silicon dioxide film with a plasma of said carbon/fluorine containing gas, wherein a carbon double bond containing perfluorocarbon gas is used as said carbon/fluorine containing gas.

of radio frequency power applied to a lower electrode of an etching apparatus in a fourth embodiment of the present invention.

Figure 8:
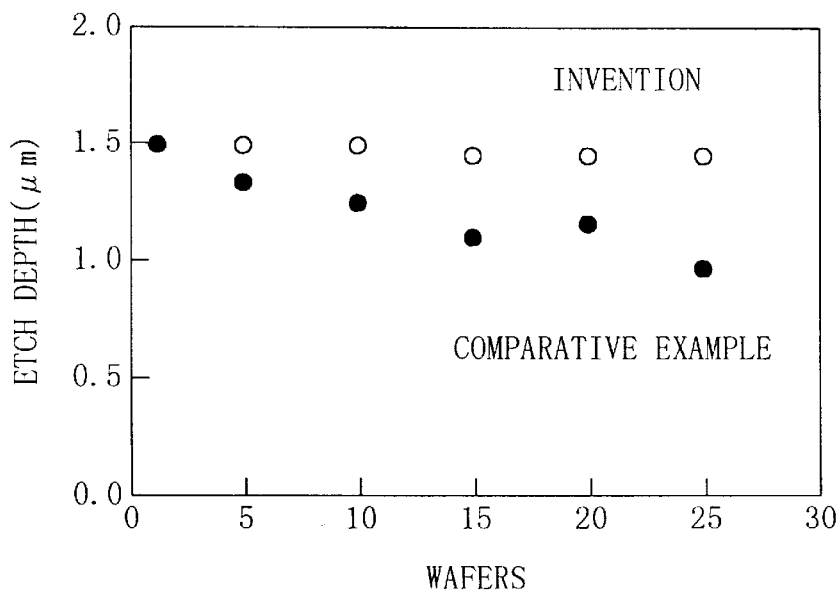

FIG. 8 is a graph showing dependency of the contact hole etching depth upon the processed wafer count (the number of processed wafers) in a fifth embodiment of the present invention.

Figure 9A:
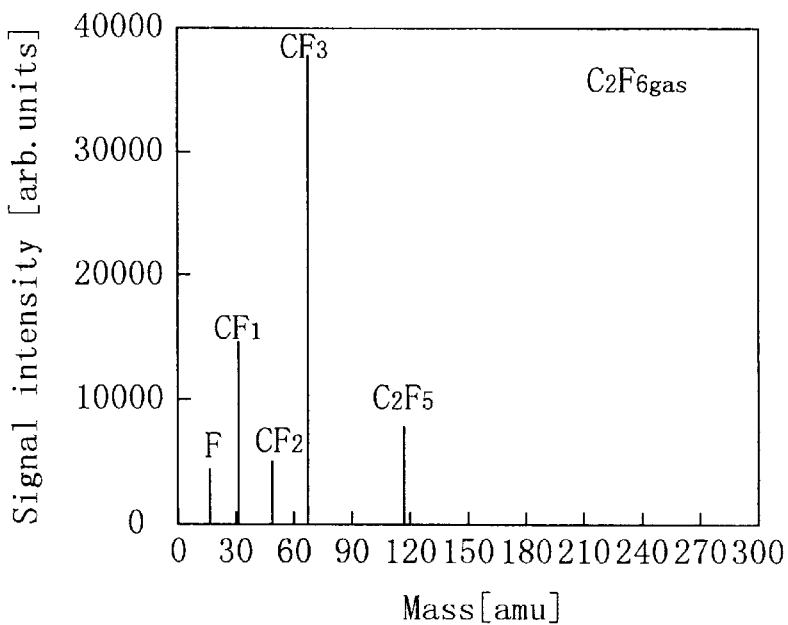
Figure 9B:
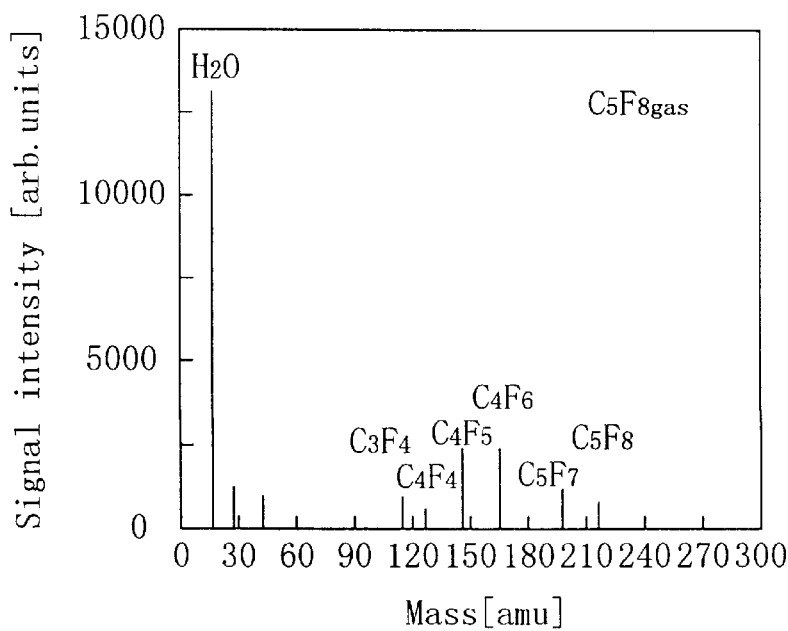

FIG. 9A is a graph showing data as to $C_2F_6$ introduced into a vacuum chamber which were obtained using a quadrupole mass spectrometer (QMS) and FIG. 9B is a graph showing data as to $C_5F_8$ which were obtained in the same way that the $C_2F_6$ data.

Figure 10:
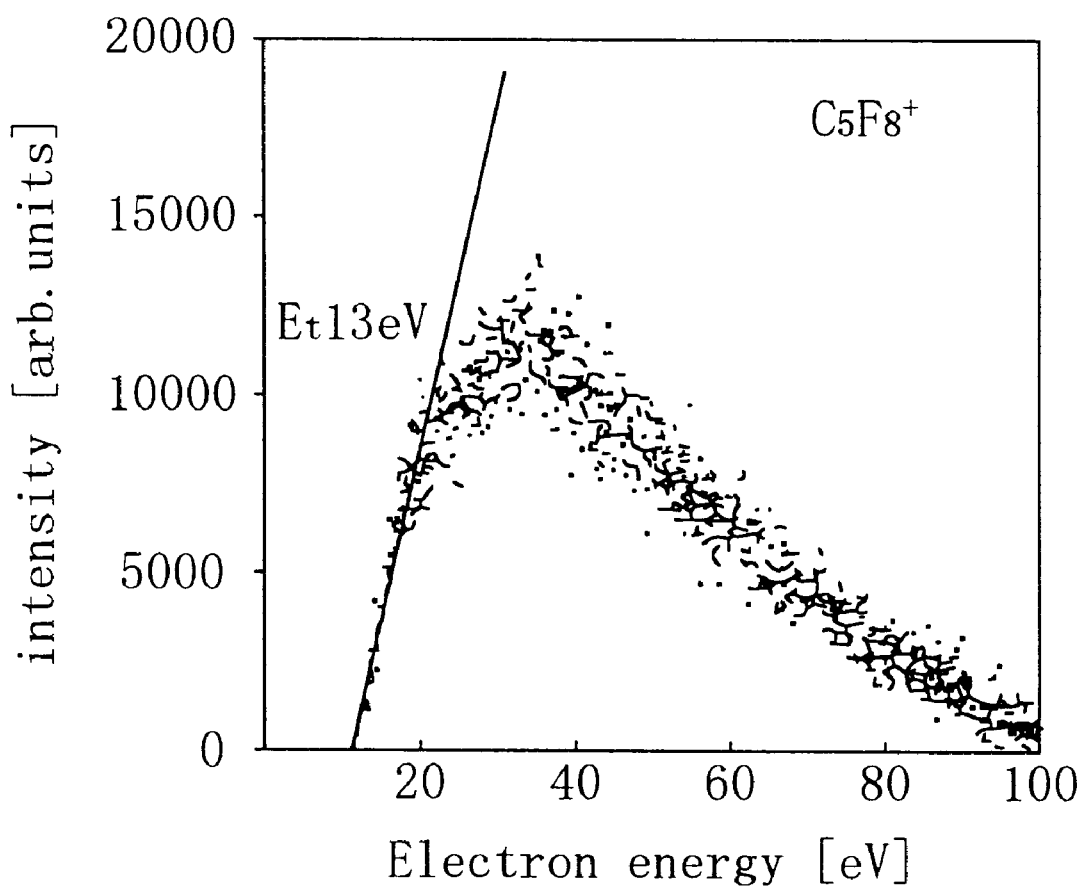

FIG. 10 is a graph showing a $C_5F_8$ ionization efficiency curve.

Figure 11:
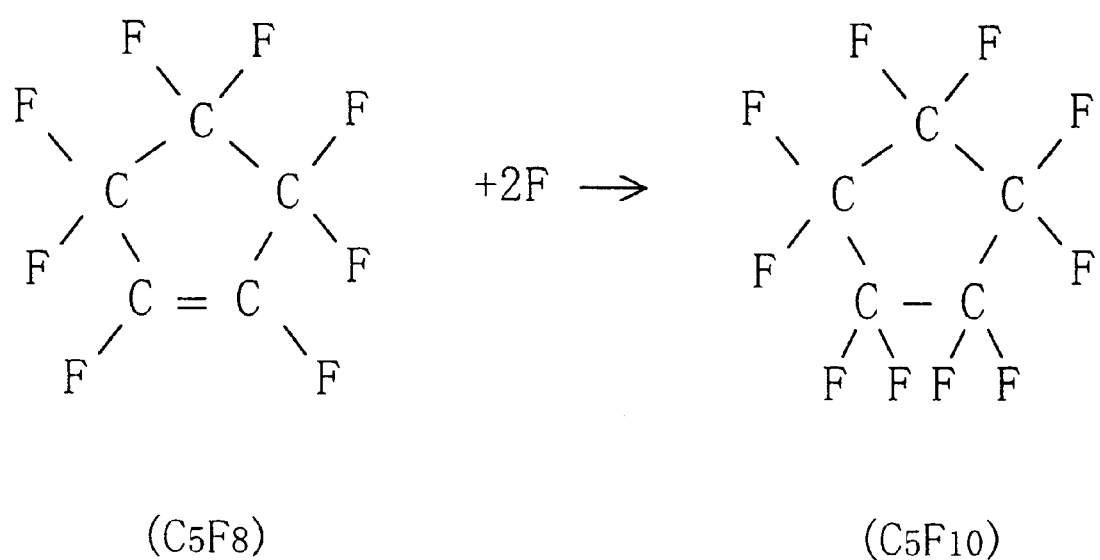

FIG. 11 depicts a flourination reaction of $C_5F_8$.

DESCRIPTION OF THE PREFERRED EMBODIMENTS

First Embodiment

Figure 1:
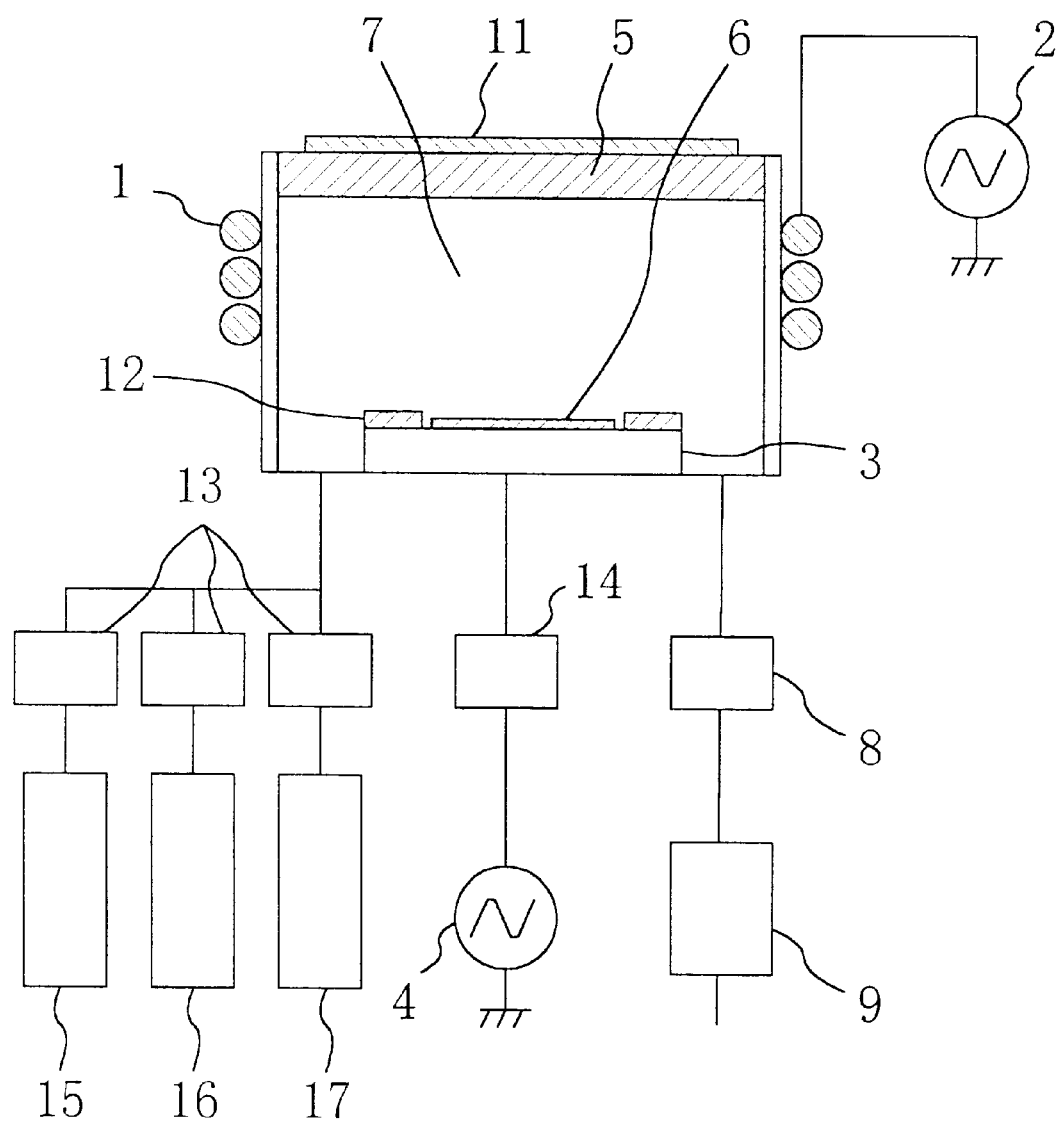
FIG. 1 is a simplified schematic diagram of a dry etching apparatus used in a first embodiment of the present invention.

Referring to FIG. 1, a first embodiment of the dry etching method in accordance with the present invention is described below. FIG. 1 is a schematic of an inductive coupled plasma dry etching apparatus employed in the first embodiment of the present invention.

The dry etching apparatus of FIG. 1 has a reactor (reaction chamber) 7 in which dry etching processes are carried out. An induction coil 1 is disposed in such a way as to encircle the sidewalls of the reactor 7 for generating plasmas. The induction coil 1 is connected to a radio frequency power source 2 to receive radio frequency power.

Disposed at a lower portion of the reactor 7 is a lower electrode 3 which supports a silicon substrate 6 upon which process steps are performed. The lower electrode 3 is connected to a radio frequency power source 4 through a matcher 14 to receive radio frequency power. A quartz ring 12 is mounted on a peripheral area of the upper surface of the lower electrode 3. An upper silicon electrode 5 is disposed at an upper portion of the reactor 7. Disposed on the upper silicon electrode 5 is a heater 11 operable to control the temperature of the interior walls of the reactor 7.

A pressure control valve 8 and an exhaust pump 9 are placed between an exhaust port of the reactor 7 and the outside. Gases for plasma formation are introduced into the reactor 7 from respective gas cylinders (such as a $C_5F_8$ gas cylinder 15, an Ar gas cylinder 16, and an $O_2$ gas cylinder 17) through mass flows 13.

In the present embodiment, prior to execution of dry etching processes, $C_5F_8$ and Ar gases are introduced into the reactor 7 from the gas cylinder 15 and from the gas cylinder 16, respectively. The $C_5F_8$ gas contains therein fluorine and carbon at a ratio of 1.6:1. The gases mixed are expelled from the exhaust port of the reactor 7 to outside the dry etching apparatus by way of the pressure control valve 8 and the exhaust pump 9. In the present embodiment, the pressure control valve 8 operates such that the reactor 7 is maintained at a fixed pressure ranging from 1 to 100 mTorr.

When the reactor 7 is supplied sufficiently with the gases, radio frequency power is applied to the induction coil 1 from the radio frequency power source 2 to generate a plasma in the reactor 7. In the present embodiment, radio frequency power at a power level of from 1000 to 3000 Watts is applied to the induction coil 1. The generated plasma comprises different types of molecules, excited atoms, and ions formed from the gases ($C_5F_8$, Ar, and $O_2$). In the present embodiment, a high density (on the order of $10^{11}$ cm$^{-3}$ or beyond) plasma is generated.

After the plasma is formed with stability, radio frequency power is applied to the lower electrode 3 from the radio frequency power source 4. As a result, the silicon substrate 6 is given a negative potential and the silicon substrate 6 is irradiated with positively charged ions from the plasma. In this way, the reactive plasma etching processing continues, and a film of silicon dioxide ($SiO_2$) formed on the silicon substrate 6 is etched.

A method of fabricating a semiconductor device in accordance with the present invention is described by reference to FIGS. 2A–2D.

A silicon substrate 20, on which semiconductor elements (not shown), such as transistor elements, were already formed or are being formed, is prepared.

Figure 2A:
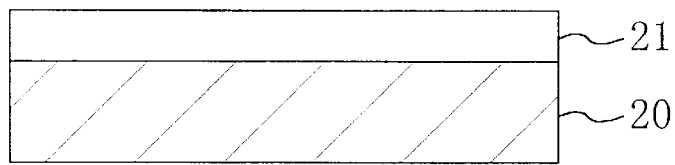
FIGS. 2A–2D show in cross section major process steps of a semiconductor device fabrication method in accordance with the present invention.
Figure 2B:
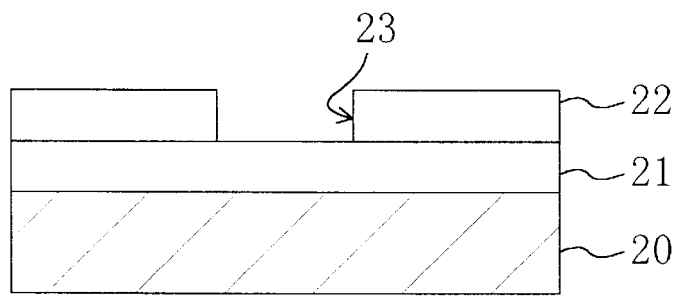
Figure 2C:
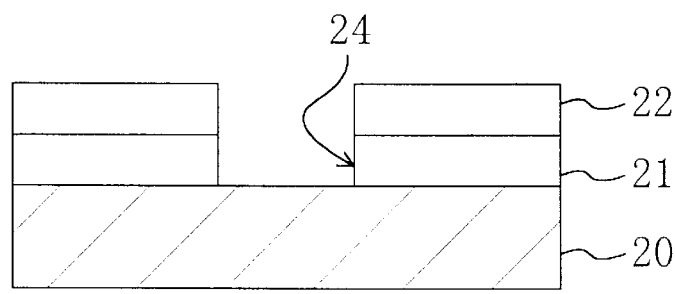

As shown in FIG. 2A, a silicon dioxide film 21 is formed on the silicon substrate 20 using a thin film deposition technique known in the art, the silicon dioxide film 21 having a film thickness of 2000 nm. This is followed by formation of a photoresist pattern 22 on the silicon dioxide film 21 by means of a photolithography technique (see FIG. 2B). The photoresist pattern 22 is exposed and developed so as to have an opening 23 which defines location/shape of a contact hole. In order to obtain high resolution, the photoresist pattern 22 is formed having a relatively thin film thickness ranging from 0.5 to 1.0 μm.

The silicon substrate 20 carrying thereon the photoresist pattern 22 is placed in the reactor 7 of the dry etching apparatus of FIG. 1. Thereafter, a gas mixture of $C_5F_8$ and Ar is introduced into the reactor 7, and the gas pressure is controlled to be between 1 mTorr and 100 mTorr.

Radio frequency power at a power level ranging from 1000 Watts to 3000 Watts is applied to the induction coil 1 of the dry etching apparatus of FIG. 1 to form a plasma. Radio frequency power ranging from 100 Watts to 2000 Watts at a frequency of 1.8 MHz is applied to the lower electrode 3 thereby applying a self-negative bias to the silicon substrate 20 and the silicon dioxide film 21 is etched to form therein a contact hole 24 (see FIG. 2C).

Figure 2D:
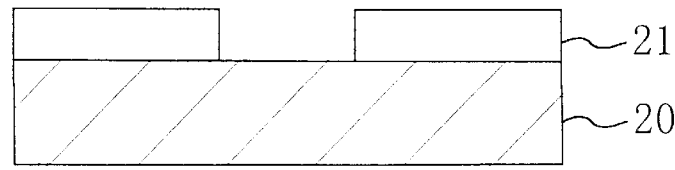

Next, as shown in FIG. 2D, the photoresist pattern 22 is removed. Thereafter, fabrication process steps known in the art are carried out to complete a target semiconductor device.

Figure 3:
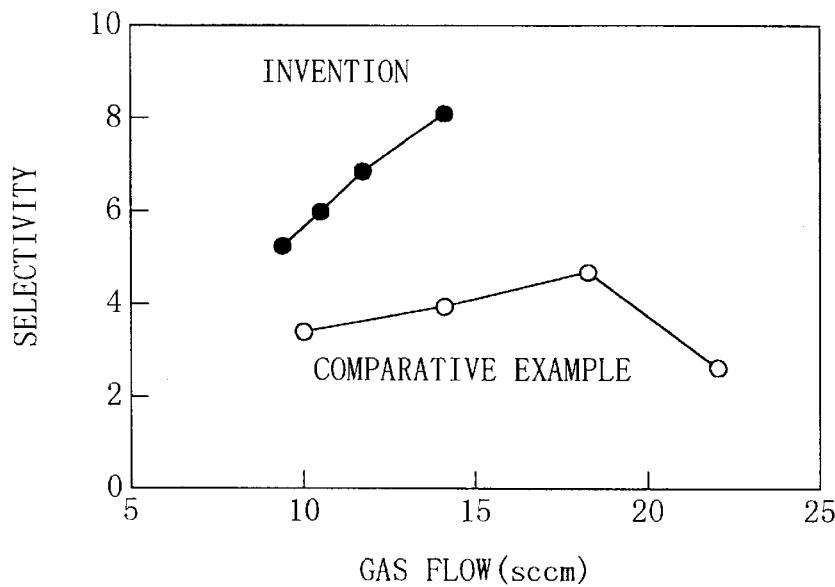
FIG. 3 is a graph showing dependency of the etching selectivity ratio upon the etching gas flowrate in the first embodiment of the present invention and an example employed for comparison to the first embodiment.

FIG. 3 shows an etching selectivity ratio versus $C_5F_8$ gas flowrate relationship. It follows from FIG. 3 that as the $C_5F_8$ gas flowrate increases, the etching selectivity ratio likewise increases for the case of the present embodiment.

On the other hand, for the case of an example employed for comparison to the present embodiment which uses a gas of $C_4F_8$, as the $C_4F_8$ gas flowrate increases the etching selectivity ratio slightly increases up to a certain point but thereafter decreases.

In a high-density plasma etching apparatus as used in the dry etching method of the present embodiment, the degree of gas dissociation is great, so that if a carbon/fluorine containing gas of the type that contains therein fluorine and carbon at a ratio of 2:1 or beyond is used, this results in an increase in fluorine radical generation amount. Because fluorine radicals are species that contribute to the etching of photoresist films, the etching selectivity ratio decreases with increasing the gas flowrate. On the other hand, use of a carbon/fluorine containing gas (such as $C_5F_8$) of the type that contains therein fluorine and carbon at a ratio of less than 2:1 generates a less amount of fluorine radicals in comparison with the $C_4F_8$ gas. Improved etching selectivity ratios are achieved, for etchant species (fluorine radicals) that contribute to the etching of photoresist films are generated in a less amount.

Second Embodiment

Figure 4:
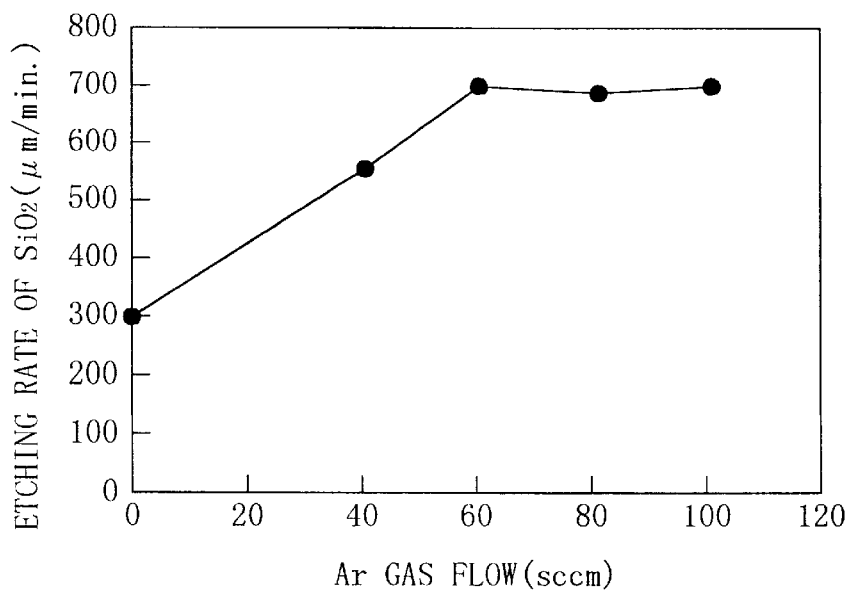
FIG. 4 is a graph showing dependency of the etching rate upon the argon gas flowrate in a second embodiment of the present invention.

Referring to FIG. 4, a second embodiment of the dry etching method in accordance with the present invention is now described below. The difference between the present embodiment and the first embodiment is that in the former, an argon (Ar) gas (which is an inert gas) is added to the $C_5F_8$ etching gas. Descriptions of the present embodiment common to the first embodiment are not repeated here. Note that a gas formed by adding an Ar gas to a $C_5F_8$ gas is hereinafter referred to as the $C_5F_8$/Ar gas.

Figure 5:
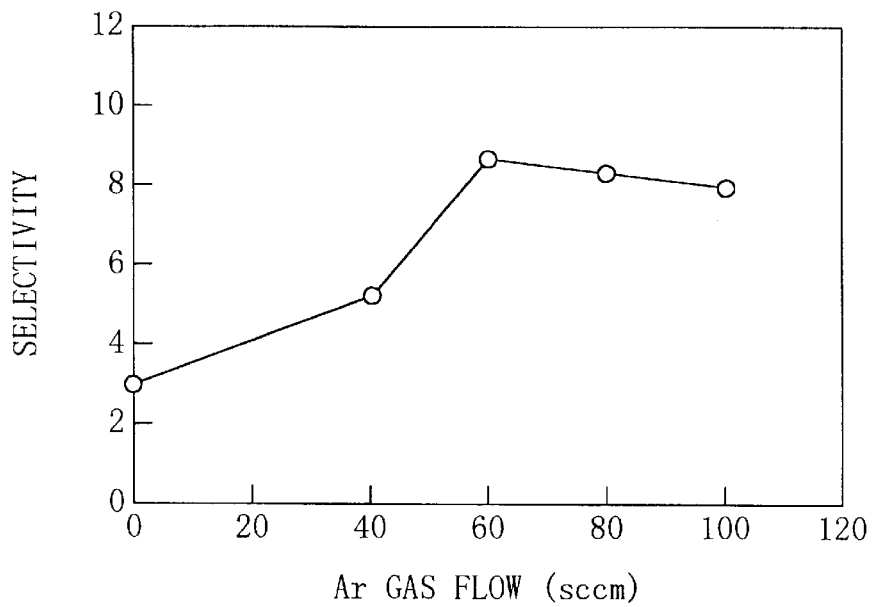
FIG. 5 graphically shows an etching selectivity ratio (to the resist film) versus additive argon gas flowrate.

FIG. 4 is a graph showing variations in the silicon dioxide film etching rate with respect to the Ar gas flowrate. FIG. 4 shows data obtained at a $C_5F_8$ gas flowrate of 14 sccm. FIG. 4 shows that as the additive Ar gas flowrate increases, the $SiO_2$ film etching rate likewise increases. FIG. 4 also shows that the $SiO_2$ film etching rate at an Ar gas flowrate of 60 sccm or above is at twice the $SiO_2$ film etching rate in the absence of an Ar gas. In the present invention, the etching gas ($C_5F_8$) contains therein fluorine and carbon at a low ratio (i.e., at a ratio of less than 2:1) therefor producing a less amount of etching species (fluorine radicals) with respect to the $SiO_2$ film. In the present embodiment, Ar is added to the etching gas, as a result of which sputtering by Ar ions greatly contributes to the etching of $SiO_2$ films, as shown in FIG. 4. In addition, since the rise in resist film etching rate by the Ar ion sputtering is small in comparison with the rise in silicon dioxide film etching rate by the Ar ion sputtering, the adding of Ar provides an increased etching selectivity ratio (which has been proved experimentally). FIG. 5 is a graph showing an etching selectivity ratio (to the resist film) versus Ar gas flowrate relationship. As can be seen from FIG. 5, the etching selectivity ratio to the resist film increases by the adding of Ar.

The adding of an inert gas such as Ar to a fluorocarbon gas, the fluorine-to-carbon ratio of which falls below 2:1, is advantageous in that both the etching selectivity ratio and the silicon dioxide film etching rate can be improved.

As an inert gas to be added to the etching gas, Ar, Xe, Kr, or a mixture of these inert gases is preferable, for the use of these gases provides good sputtering effects.

Third Embodiment

Figure 6:
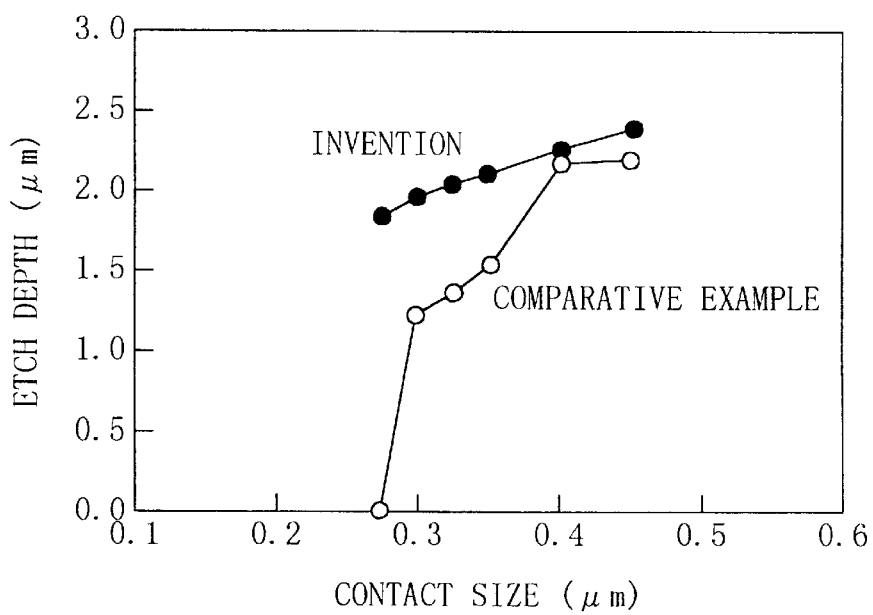
FIG. 6 is a graph showing dependency of the contact hole etching depth upon the contact hole diameter in a third embodiment of the present invention and an example employed for comparison to the third embodiment.

Referring to FIG. 6, a third embodiment of the dry etching method of the present invention is now described below. The difference between the present embodiment and the second embodiment is that in the former, a gas of oxygen is added to the $C_5F_5$/Ar etching gas. The oxygen gas is supplied through the mass flow 13 into the reactor of the plasma etching apparatus. Descriptions of the present embodiment common to the first and second embodiments are not repeated here.

FIG. 6 is a graph showing dependency of the contact hole etching depth upon the contact hole diameter for the purpose of comparing a case where $O_2$ is added to the $C_5F_8$/Ar etching gas with a case where no $O_2$ is added to the $C_5F_8$/Ar etching gas. The flowrates of the $C_5F_8$, Ar, and $O_2$ gases are 14 sccm, 80 sccm, and 3 sccm, respectively. In the absence of $O_2$, as the contact hole diameter decreases the etchable contact hole depth abates. From this, it follows that the etching process will stop if the contact hole diameter becomes less than 0.3 μm. In the interior of the contact hole, the amount of incident ions becomes less than the amount of etching radicals. This means that deposition of a polymer film is likely to occur rather than the etching process. Such an interruption in etching is caused by the fact that polymer film deposition predominates over the etching process.

The adding of $O_2$ to the $C_5F_8$/Ar etching gas prevents the above-described etching interruption from occurring for the reason that the oxygen has the ability to suppress an excessive polymer film deposition on silicon dioxides. If etching gases contain therein fluorine and carbon at a ratio of less than 2:1, then polymer film depositions are likely to be formed. The adding of $O_2$ adequately reduces the amount of polymer film deposition thereby providing effective contact hole etching. The effect of reducing the amount of polymer film deposition by the adding of $O_2$ can be given by the following reaction formulas.

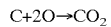

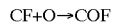

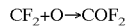

A preferable range of the adding of $O_2$ gas is from about 5% to about 50% with respect to the $C_5F_8$ gas flowrate.

Fourth Embodiment

Figure 7:
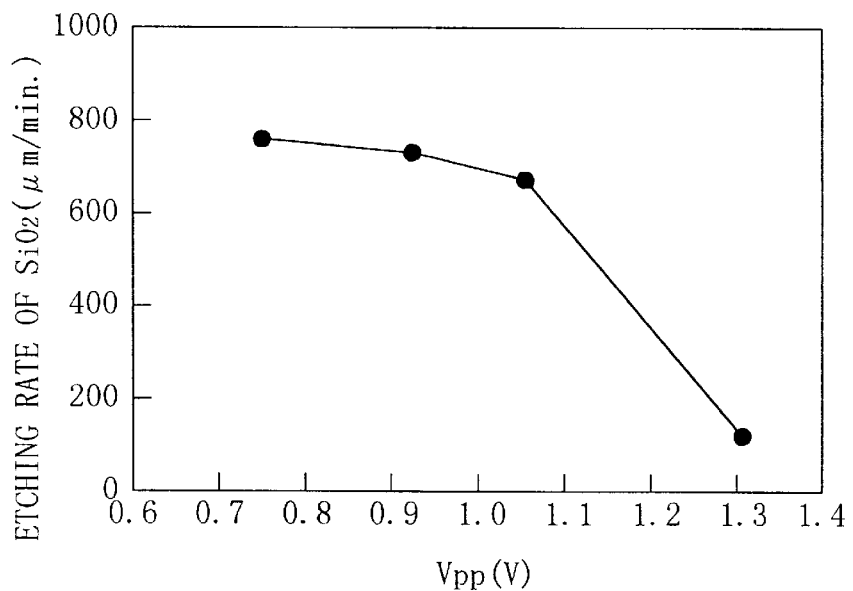
FIG. 7 is a graph showing variations in the oxide film etching rate with respect to the peak-to-peak voltage (Vpp)

Referring to FIG. 7, a fourth embodiment of the dry etching method in accordance with the present invention will be described. The present embodiment employs the dry etching apparatus of FIG. 1. Gases for plasma formation, i.e. $C_5F_8$/Ar/$O_2$ (at flowrates of 14 scam, 80 sccm, and 3 scam respectively), are used. The peak-to-peak voltage of radio frequency power that is applied to the lower electrode 3 of the apparatus of FIG. 1 is optimized in the present embodiment.

Referring again to FIG. 7, therein shown is variation in the silicon dioxide film etching rate with respect to the peak-to-peak voltage (Vpp) of radio frequency power delivered to the lower electrode 3. It follows from FIG. 7 that as the peak-to-peak voltage (Vpp) increases, the $SiO_2$ film etching rate decreases. When the peak-to-peal voltage (Vpp) goes beyond 1.5 kV, it is difficult to obtain significant etching rates, and it is impossible to form contact holes. In order to obtain a significant etching rate, it is necessary to hold the peak-to-peak voltage (Vpp) below 1.5 kV, preferably below 1.0 kV. Note that in the foregoing first to third embodiments and in the following embodiment, the voltage amplitude value (Vpp) of radio frequency power that is applied to the lower electrode 3 is set at 0.9 kV.

Fifth Embodiment

Referring to FIG. 8, a fifth embodiment of the dry etching method in accordance with the present invention is now described below. The difference between the present embodiment and the other embodiments is that in the former, it is controlled such that the wall surface temperature of the reactor 7 of the apparatus 1 is in excess of a given value.

FIG. 8 graphically shows a contact hole etching depth versus processed wafer count relationship. FIG. 8 shows data that were obtained using $C_5F_8$/Ar/$O_2$ gases (at flow rates of 14 sccm, 80 sccm, and 3 sccm respectively) as gases for plasma formation. When the reactor wall surface temperature is below 100 degrees centigrade, it follows from FIG. 8 that the contact hole etching depth decreases as the processed wafer count increases. On the other hand, when the reactor wall surface temperature is 100 degrees centigrade or more (the present embodiment), the contact hole etching depth does not vary with the processed wafer count. Particularly, when the reactor wall surface temperature is 150 degrees centigrade or more, stable contact hole etching depths can be realized, the reason for which may be explained as follows.

When a gas (the fluorine-to-carbon ratio of which is less than 2:1) is employed to generate a plasma, the percentage of carbon contained in the generated plasma relatively increases in comparison with employing a conventional fluorocarbon gas, in other words the generated plasma becomes carbon-rich. When an etching process is carried out using a plasma of the carbon-rich type, a polymer film is likely to deposit on the wall surfaces of the reactor 7 if the reactor wall surface temperature is below 100 degrees centigrade. As the number of processed wafers increases, polymer film depositions accumulate on the reactor wall surfaces thereby increasing in thickness. If an etching process is carried out with polymer film depositions formed on the reactor wall surfaces, this results in etching a part of the polymer film thereby increasing the amount of carbon in the plasma. As the number of processed wafers increases the amount of carbon in the plasma likewise increases. As a result, the contact hole etching depth becomes reduced.

If the reactor wall surface temperature is increased to above 100 degrees centigrade (at least at etching process time), the deposition of polymer films on the wall surfaces of the reactor 7 is reduced. The reason may be that when the reactor wall surface temperature is above 100 degrees centigrade, it is impossible for atoms or molecules necessary for formation of polymer films to stay on the heated wall surfaces for a sufficient length of time. As a result, the amount of carbon contained in the plasma becomes constant, thereby allowing the contact hole etching depth to be independent upon the number of processed wafers. As can be seen from the above, it is very effective to increase the reactor wall surface temperature to above 100 degrees centigrade when performing etching processes with a gas that contains therein fluorine and carbon at a ratio of less than 2:1.

In each of the foregoing embodiments of the present invention, the $C_5F_8$ gas is used as a gas which contains therein fluorine and carbon at a ratio of less than 2:1. Instead of employing the $C_5F_8$ gas, $C_4F_6$, $C_3F_4$, $C_2F_2$, $(CF_3CO)_2$, or a mixture of these gases can be used. Instead of adding $O_2$ to the etching gas, a gas containing therein oxygen (such as CO or $CO_2$) can be added.

The essence of the present invention is that in plasmas to be generated, the ratio of the amount of fluorine to that of carbon is less than 2:1. Even when a gas (in which the ratio of the number of atoms of fluorine per molecule to the number of atoms of carbon per molecule is above 2:1) is slightly added to an etching gas (in which the ratio of the number of atoms of fluorine per molecule to the number of atoms of carbon per molecule is less than 2:1), the advantageous effects of the present invention can be obtained satisfactorily as long as the ratio of the amount of fluorine to that of carbon in the entire etching gas used for plasma formation is less than 2:1.

As a high density plasma etching apparatus for performing the above-described dry etching method of the present invention, the inductive coupled plasma dry etching apparatus of FIG. 1 has been described. However, different etchers (such as an electron cyclotron resonance plasma etcher, a helicon wave excitation plasma etcher, or a surface wave excitation plasma etcher) can be used. In addition, an inductive coupled plasma dry etching apparatus of the type with an induction coil mounted at an upper portion of a reactor can be used.

FIG. 9A shows analysis data that were obtained by mass spectrometry of $C_2F_6$ (which was introduced into a vacuum chamber) by means of a quadrupole mass spectrometer (QMS). FIG. 9B shows analysis data as to $C_5F_8$ obtained in the same way that the analysis data of FIG. 9A were obtained. An electron energy of 70 eV was used in the QMS.

It follows from FIG. 9A that for the case of the $C_2F_6$ gas, low order species including $CF_1$, $CF_2$, and $CF_3$ are dominant, while other species, i.e. high order species, were observed in only a small amount. On the other hand, for the case of the $C_5F_8$ gas, many high order species such as $C_3F_4$, $C_4F_4$, $C_4F_5$, $C_4F_6$, $C_5F_7$, and $C_5F_8$ were observed as shown in FIG. 9B. These phenomenona of FIGS. 9A and 9B occur even when there is made a variation in the electron energy.

FIG. 10 shows a $C_5F_8$ ionization efficiency curve. It follows from FIG. 10 that positive ions ($C_5F_8^+$) are generated at a relatively low electron energy of 13 eV. Even when the electron energy is high, the generation percentage of $C_5F_8^+$ is still high and the destruction of $C_5F_8$ is unlikely to occur. On the other hand, the $C_2F_6$ gas has the tendency of being decomposed apart by low energy electrons and positive ions such as $C_2F_6^+$ are not observed.

The above-described experimental results shows that in comparison with the $C_2F_6$ gas, the $C_5F_8$ gas is more unlikely to be discomposed when striking electrons, because of which high order species are generated much from the $C_5F_8$ gas while low order species are generated from the $C_2F_6$ gas.

The $C_5F_8$ gas is a carbon double bond containing perfluorocarbon gas. Such a gas is unlikely to be discomposed into low order species by electon bombardment and is relatively stable. When one of the carbon bonds of the $C_5F_8$ gas is cut off, it may be considered that a cut-off bonding hand captures a floating fluorine atom, as is shown in FIG. 11 (fluorine-scavenge-effect by the double bond).

The $C_5F_8$ gas is available to form a high density, low disassociation plasma. Parallel plate etchers are suitably applicable in forming low disassociation plasmas. The use of the $C_5F_8$ gas permits other types of etchers to form a plasma sufficiently low in disassociation.

By formation of a plasma with a gas of $C_5F_8$ having the above-described features and by etching of contact holes, the amount of fluorine that contributes to the etching of resist films is further reduced. It may be considered that generated high order species form polymeric passivating layers on resist films to limit the resist film etching.

From the above, it may be considered that if a plasma etching process is carried out using carbon double bond containing perfluorocarbon gases (such as $C_5F_8$), this can provide greatly improved etching selectivity ratios with respect to the resist film. Accordingly, gases with a fluorine-to-carbon ratio of less than 2:1 is preferable, particularly a carbon double bond containing perfluorocarbon gas being most preferable to use. Additionally, it may be considered that any carbon double bond containing perfluorocarbon gas (even when its fluorine-to-carbon ratio is above 2:1) is able to provide an improved etching selectivity ratio to the resist film.

For the case of an etching process with $C_5F_8$, the $C_5F_8$ gas is supplied from the gas cylinder, for example, at a pressure of about 0.01 kg/cm². The supply pressure of the $C_5F_8$ gas is considerably low in comparison with that of the $C_2F_6$ gas, the reason for which is that the $C_5F_8$ is liquefied in the cylinder while the $C_2F_6$ gas is held in the gas cylinder in a high pressure gaseous state. The $C_5F_8$ supply pressure is that low, so that it is not preferable to use a mass flow controller (for example, one disposed in a conventional dry etching apparatus) for controlling a gas flowrate. It is preferred that a pressure control type flow meter operable to control the opening/closing of a valve by means of gas pressure is used. Such a pressure control type flow meter has been used in, for example, CVD apparatus for copper. A typical pressure control type flow meter has a built in pressure gage. Such a pressure gage tends to zero-point drift. It is therefore preferred that the pressure gage is capable of automatic zero-point adjustment.

In each of the above-described embodiments of the present invention, silicon serves as a material for forming a substrate on which silicon dioxide is formed. Other substrates of different materials such as a substrate of glass can be used. It is however to be noted that in the case of using a glass substrate, the glass substrate itself is etched because the glass substrate contains $SiO_2$ as its major component. If (a) a polycrystalline silicon film or an amorphous silicon film is formed on a glass substrate before forming a silicon dioxide film as a covering for the polycrystalline silicon film or the amorphous silicon film (whichever is formed on the glass substrate) and (b) a given area of the silicon dioxide film is masked with a resist film, this enables the present invention to employ glass substrates. There is the possibility that semiconductor devices with thin film transistors formed on substrates of glass and other materials will be integrated increasingly in scale in the future. The present invention is expected to provide considerably favorable effects when applied to the fabrication of such semiconductor devices.

In accordance with the present invention, since an etching gas for plasma formation has a fluorine-to-carbon ratio of less than 2:1, this provides some advantages. One advantage is that an improved etching selectivity ratio to the resist film is achieved. Another is that defects, such as a short circuit between interconnect lines, are unlikely to occur.

The adding of an inert gas to the aforesaid etching gas provides not only improved etching selectivity ratios but also increased silicon dioxide film etching rates.

If both an inert gas and a gas containing oxygen are added to the foregoing etching gas, this not only provides improved etching selectivity ratios but also prevents defects due to an interruption in etching.

In accordance with the present invention, since (a) an etching gas for plasma formation has a fluorine-to-carbon ratio of less than 2:1 and (b) a radio frequency voltage, the peak-to-peak voltage of which falls below 1.5 kV, is applied to a substrate upon which process steps are performed, this provides not only improved etching selectivity ratios but also increased silicon dioxide film etching rates.

In accordance with the present invention, since (a) an etching gas for plasma formation has a fluorine-to-carbon ratio of less than 2:1 and (b) an etching process is carried out in a reactor heated to above 100 degrees centigrade, this prevents etching depth from varying with increase in the number of processed wafers.

In accordance with the present invention, it is possible to fabricate semiconductor devices free from defects caused by a short circuit between interconnect lines, with an increase in manufacturing yield.

What is claimed is:

1. A dry etching method comprising:
   introducing an etching gas containing at least carbon and fluorine into a reactor within which a lower electrode for supporting a substrate to be processed is formed;
   generating a plasma comprising the etching gas in the reactor; and
   performing an etching process on the substrate to be processed using the plasma by applying a radio frequency power to the lower electrode,
   wherein the ratio of the fluorine and the carbon contained in the etching gas is less than 2:1, and
   the etching process on the substrate to be processed is performed in the reactor with a wall surface of the reactor heated to above 100 degrees centigrade.

2. The dry etching method of claim 1,
   wherein the etching gas contains at least one of a $C_5F_8$ gas, a $C_4F_6$ gas, a $C_3F_4$ gas, a $C_2F_2$ gas and a $(CF_3CO)_2$ gas.

3. The dry etching method of claim 1,
   wherein the etching gas contains an inert gas.

4. The dry etching method of claim 3,
   the inert gas comprises at least one of an Ar gas, an Xe gas and a Kr gas.

5. The dry etching method of claim 1,
   wherein the etching gas contains an oxygen containing gas.

6. The dry etching method of claim 5,
   wherein the oxygen containing gas comprises at least one of an $O_2$ gas, a CO gas and a $CO_2$ gas.

7. The dry etching method of claim 1,
   wherein the plasma has a plasma density of $10^{11}$ cm$^{-3}$ or more.

8. A dry etching method comprising:
   introducing an etching gas containing at least carbon and fluorine into a reactor within which a lower electrode for supporting a substrate to be processed is formed;
   generating a plasma comprising the etching gas in the reactor; and
   performing an etching process on the substrate to be processed using the plasma by applying a radio frequency power to the lower electrode,
   wherein the ratio of the fluorine and the carbon contained in the etching gas is less than 2:1, and
   the radio frequency power has a peak-to-peak voltage of 1.5 kV or less.

9. The dry etching method of claim 8,
   wherein the etching gas contains at least one of a $C_5F_8$ gas, a $C_4F_6$ gas, a $C_3F_4$ gas, a $C_2F_2$ gas and a $(CF_3CO)_2$ gas.

10. The dry etching method of claim 8,
    wherein the etching gas contains an inert gas.

11. The dry etching method of claim 10,
    the inert gas comprises at least one of an Ar gas, an Xe gas and a Kr gas.

12. The dry etching method of claim 8,
    wherein the etching gas contains an oxygen containing gas.

13. The dry etching method of claim 12,
    wherein the oxygen containing gas comprises at least one of an $O_2$ gas, a CO gas and a $CO_2$ gas.

14. The dry etching method of claim 8,
    wherein the plasma has a plasma density of $10^{11}$ cm$^{-3}$ or more.

15. The dry etching method of claim 8,
    wherein the etching on the substrate to be processed is performed in the reactor with a wall surface of the reactor heated to above 100 degrees centigrade.

16. A method of fabricating a semiconductor device comprising:

depositing a silicon dioxide film on a substrate;

forming a resist pattern on the silicon dioxide film;

placing the substrate on which the silicon dioxide film and the resist pattern are formed on a lower electrode formed within a reactor;

introducing an etching gas containing at least carbon and fluorine into the reactor;

generating a plasma comprising the etching gas in the reactor; and performing an etching process on the silicon dioxide film using the plasma and the resist pattern as a mask by applying a radio frequency power to the lower electrode, wherein the ratio of the fluorine and carbon contained in the etching gas is less than 2:1, and the etching process on the silicon dioxide film is performed in the reactor with a wall surface of the reactor heated to above 100 degrees centigrade.

17. The method of fabricating a semiconductor device of claim 16, wherein the etching gas contains an inert gas.

18. The method of fabricating a semiconductor device of claim 16, wherein the etching gas contains an oxygen containing gas.

19. A method of fabricating a semiconductor device comprising:

deposition a silicon dioxide film on a substrate;

forming a resist pattern on the silicon dioxide film;

placing the substrate on which the silicon dioxide film and the resist pattern are formed on a lower electrode formed within a reactor;

introducing an etching gas containing at least carbon and fluorine into the reactor;

generating a plasma comprising the etching gas in the reactor; and performing an etching process on the silicon dioxide film using the plasma and the resist pattern as a mask by applying a radio frequency power to the lower electrode, wherein the ratio of the fluorine and the carbon contained in the etching gas is less than 2:1, and the radio frequency power has a peak-to-peak voltage is 1.5 kV or less.

20. The method of fabricating a semiconductor device of claim 19, wherein the etching gas contains an inert gas.

21. The method of fabricating a semiconductor device of claim 19, wherein the etching gas contains an oxygen containing gas.

22. The method of fabricating a semiconductor device of claim 19, wherein the etching process on the silicon dioxide film is performed in the reactor with a wall surface of the reactor heated to above 100 degrees centigrade.

23. A dry etching method comprising:

introducing an etching gas containing at least carbon and fluorine into a reactor within which a lower electrode for supporting a substrate to be processed is formed;

generating a plasma comprising the etching gas in the reactor; and performing an etching process on the substrate to be processed using the plasma by applying a radio frequency power to the lower electrode, wherein the etching gas contains a carbon double bond containing perfluorocarbon gas, and the etching process on the substrate to be process is performed in the reactor with a wall surface of the reactor heated to above 100 degrees centigrade.

24. A method of fabricating a semiconductor device comprising:

depositing a silicon dioxide film on a substrate;

forming a resist pattern on the silicon dioxide film;

placing the substrate on which the silicon dioxide film and the resist pattern are formed on a lower electrode formed within a reactor;

introducing an etching gas containing at least carbon and fluorine into the reactor;

generating a plasma comprising the etching gas in the reactor; and performing an etching process on the silicon dioxide film using the plasma and the resist pattern as a mask by applying a radio frequency power to the lower electrode, wherein the etching gas contains a carbon double bond containing perfluorocarbon gas, and the etching process on the silicon dioxide film is performed in the reactor with a wall surface of the reactor heated to above 100 degrees centigrade.

* * * * *